US012534804B2

(12) United States Patent
Gao et al.

(10) Patent No.: US 12,534,804 B2
(45) Date of Patent: Jan. 27, 2026

(54) ATOMIC LAYER DEPOSITION DEVICE FOR UNIFORM COATING ON INNER SURFACE OF DOME SHAPED SURFACE

(71) Applicants: HARBIN INSTITUTE OF TECHNOLOGY, Harbin (CN); ZHENGZHOU RESEARCH INSTITUTE OF HIT, Zhengzhou (CN)

(72) Inventors: Gang Gao, Harbin (CN); Kun Li, Harbin (CN); Jiaqi Zhu, Harbin (CN); Lei Yang, Harbin (CN); Chao Duan, Harbin (CN)

(73) Assignees: HARBIN INSTITUTE OF TECHNOLOGY, Harbin (CN); ZHENGZHOU RESEARCH INSTITUTE OF HIT, Zhengzhou (CN)

( * ) Notice: Subject to any disclaimer, the term of this patent is extended or adjusted under 35 U.S.C. 154(b) by 2 days.

(21) Appl. No.: 18/825,231

(22) Filed: Sep. 5, 2024

(65) Prior Publication Data

US 2025/0236953 A1 Jul. 24, 2025

(30) Foreign Application Priority Data

Jan. 23, 2024 (CN) ......................... 202410093201.4

(51) Int. Cl.
*C23C 16/455* (2006.01)
*C23C 16/04* (2006.01)

(52) U.S. Cl.
CPC ...... *C23C 16/45544* (2013.01); *C23C 16/045* (2013.01); *C23C 16/45574* (2013.01)

(58) Field of Classification Search
CPC .................... C23C 16/45544; C23C 16/45578
See application file for complete search history.

(56) References Cited

U.S. PATENT DOCUMENTS

2014/0120257 A1* 5/2014 Ripley .............. C23C 16/45578 427/255.28

* cited by examiner

*Primary Examiner* — Andrew J Bowman

(57) ABSTRACT

Provided is an atomic layer deposition device for uniform coating on an inner surface of a dome shaped surface. A gas channel member in the atomic layer deposition device is vertically fixed to a cabin base, and a peripheral edge is arranged on an upper surface of a gas extraction plate in a circumferential direction, and a gas cavity is enclosed by the peripheral edge, a flange and a cover plate. The gas extraction plate is fixed to an upper surface of the gas channel member, and a hollow spherical shell is fixedly arranged on an upper surface of the cover plate. A sample support is sleeved outside the gas channel member, and a dome shaped sample is placed on an annular platform of the sample support. Lower surface of the cabin cover is provided with a dome shaped heater.

10 Claims, 17 Drawing Sheets

ATOMIC LAYER DEPOSITION DEVICE FOR UNIFORM COATING ON INNER SURFACE OF DOME SHAPED SURFACE

CROSS-REFERENCE TO RELATED APPLICATION

This patent application claims the benefit and priority of Chinese Patent Application No. 202410093201.4 filed with the China National Intellectual Property Administration on Jan. 23, 2024, the disclosure of which is incorporated by reference herein in its entirety as part of the present application.

TECHNICAL FIELD

The present disclosure relates to an atomic layer deposition device for uniform coating on an inner surface of a dome shaped surface.

BACKGROUND

Various functional optical thin films need to be coated on the surfaces of optical lenses and windows to achieve diversified function such as filtering, antireflection, and hardening protection. In order to meet the needs in some special scenes, some optical windows are curved, with surface shapes usually have a certain radius of curvature, e.g., a dome shaped sample with fixed radius of curvature, or a deep-arched surface with continuous variable radius of curvature. The achievement of uniform coating on an inner surface or outer surface of the dome shaped curved-surface optical window has extremely high requirements and difficulties. The existing coating technology has some shortcomings in uniform coating on the curved surfaces. Magnetron sputtering and evaporation coating technologies can achieve uniform coating on the outer surface of the curved surface under some working conditions by designing a special sample support shape, designing a linkage mechanism between a target and a sample, and finely controlling the coating process. However, the uniformity of the coating is poor, which easily leads to diffraction Newton ring phenomenon caused by non-uniform film thickness, seriously damaging the appearance and performance of the window. Moreover, when the curved-surface radius of the window decreases, the aspect ratio increases and the inner surface needs to be coated, the difficulty of uniform coating is further increased, and the uniformity of the film layer is deteriorated drastically, and even coating cannot be carried out. The pulsed laser deposition, molecular beam epitaxy and chemical vapor deposition technologies are not suitable for the coating of the curved surface due to the limitation of the technology itself.

In addition to the traditional coating technology, atomic layer deposition (ALD) can achieve layer-by-layer deposition of single atom thickness through cyclic alternating reaction of precursors. Compared with other coating technologies, the ALD technology can precisely control the characteristics of thin films at the atomic level, achieve a bottom-up layered growth mechanism through layer-by-layer surface chemical saturation adsorption reaction, and has unique self-limiting growth characteristics, as well as excellent high accuracy, high flatness, high adhesion, low temperature deposition and excellent three-dimensional conformality. Therefore, the ALD technology has unique advantages in the field of uniform coating of an ultra-thin film layer, a complex film system and a 3D structure (e.g., a micro-nano structure, a plane, a curved surface, and a macro-complex surface), and has been applied to the fields of semiconductors, integrated circuits, photovoltaics, optical coatings, and the like. The ALD technology originated in Finland in the 1970s. After long-term development, the technology has become mature and industrialized. At present, the mainstream ALD technology and equipment vendors are mainly distributed in Europe, Japan, the United States, and other countries, and the development of the ALD technology in China is relatively slow and backward. Up to now, the ALD technology in China has mastered certain coating and equipment design, manufacturing, production and application technologies in conventional film layers such as aluminum oxide and silicon oxide and in the conventional fields such as wafer-level film deposition, but there is still a certain gap with other countries in the field of high level technology and high level equipment.

The ALD technology has incomparable advantages in the field of curved-surface coating compared with traditional coating methods, but the existing ALD equipment is still dominated by meeting the requirements for thin-film deposition on the surface of an inch wafer sample. The equipment is more suitable for coating a flat sample, and mainly pursues to achieve large-scale automatic wafer thin-film deposition by optimizing a cabin structure, or to significantly improve the deposition efficiency by using a new spatial ALD technology. There is almost no equipment for coating the surface of a dome shaped optical window with a curved surface, a large aspect ratio and large size. Although there is large cabin structure equipment among the ALD equipment in some countries, theoretically, the uniform deposition of the film layer can be achieved by using the vapor deposition characteristics of the ALD technology, the method still has disadvantages in uniform heating of the large-size curved-surface sample, and the high sensitivity of the ALD technology to the deposition temperature has high requirements on the uniformity and stability of a temperature field on the surface of the sample, making the applicability limited. The ALD technology in China, due to the limitation of technical barriers, is in the early stage of development. The scientific ALD equipment accounts for a relatively high proportion, almost all of which are flat small cabin structures, and cannot undertake the task of uniform coating of the large-size curved-surface optical window.

SUMMARY

For solving the problems of poor uniformity and stability of coating on an inner surface of a curved-surface optical window in an existing coating technology, a purpose of the present disclosure is to provide an atomic layer deposition device for uniform coating on an inner surface of a dome shaped surface, thus achieving uniform coating on the inner surface of the dome shaped sample.

An atomic layer deposition device for uniform coating on an inner surface of a dome shaped surface includes a cabin cover, a dome shaped heater, a hollow dome shaped shell, a cover plate, a gas extraction plate, a disc heater, a gas channel member, a cylindrical heater, a sample support, a cabin, and a cabin base. A first gas inlet and a first gas outlet are formed in the cabin base; the gas channel member is cylindrical, a gas inlet passage and a gas outlet passage are formed in the gas channel member along an axial direction of the gas channel member; the gas channel member is vertically fixed to an upper surface of the cabin base, the gas inlet passage in the gas channel member is in communication with the first gas inlet, and a gas outlet passage in the gas channel member is in communication with the first gas outlet; the cylindrical heater is sleeved outside the gas channel member.

The gas extraction plate is disc-shaped, a peripheral edge is formed on an upper surface of the gas extraction plate in a circumferential direction of the gas extraction plate, multiple gas holes are formed in the peripheral edge in a radial direction of the peripheral edge, and the plurality of gas holes are uniformly distributed in the circumferential direction of the gas extraction plate; a second gas inlet and a second gas outlet are formed in the gas extraction plate, a flange is arranged on a circumference of the second gas inlet, and an upper surface of the peripheral edge and an upper surface of the flange are flush with each other; the cover plate covers the gas extraction plate and is fixed to the gas extraction plate; a third gas inlet is formed in the cover plate, and in communication with the second gas inlet; a gas cavity is enclosed by the peripheral edge, the flange and the cover plate.

The gas extraction plate is fixed to an upper surface of the gas channel member, the second gas inlet is in communication with the gas inlet passage in the gas channel member, and the second gas outlet is in communication with the gas outlet passage in the gas channel member; the disc heater is arranged on a lower surface of the gas extraction plate, the hollow dome shaped shell is fixed to an upper surface of the cover plate, and a central gas hole is formed in a center of the hollow dome shaped shell.

The sample support is mounted on the cabin base, and sleeved outside the gas channel member; an annular platform is formed on a top of the sample support, and a dome shaped sample is placed on the annular platform and is located above and covers the hollow dome shaped shell; a ventilation gap is arranged between the dome shaped sample and the hollow dome shaped shell, and a further ventilation gap is arranged between the sample support and the cover plate as well as the gas extraction plate.

The cabin is mounted on the cabin base, and sleeved outside the sample support, a top of the cabin is covered with the cabin cover, the dome shaped heater is arranged on a lower surface of the cabin cover, and the dome shaped heater covers an upper portion of the dome shaped sample.

By designing a cabin structure of an atomic layer deposition device, the uniform coating on an inner surface of the dome shaped surface is achieved, and an active control of a gas flow field is achieved, thus obtaining a more uniform and stable flow field distribution. Uniform and stable heating for the dome shaped curved-surface sample is achieved by reasonably designing a heating mode.

The atomic layer deposition device for uniform coating on the inner surface of the dome shaped surface mainly includes the following structural characteristics:

1. Cabin Configuration:

The uniform coating on the inner surface of the dome shaped surface can be achieved through a special configuration design of the cabin.

2. Series Two-Stage Pressure Stabilizing Structure:

The gas inlet passage in the gas channel member is used to achieve the first pressure relief, and the second pressure relief can be achieved in the hollow dome shaped shell. The gas channel member is connected to the hollow spherical shell in series to form a two-stage pressure stabilizing structure, which is used for stabilizing a gas pressure, conducive to acquiring a more stable gas flow field, and plays an important role in uniform coating.

3. Active Flow Guiding Structure:

A coating gas is confined in a limited space between an inner surface of the dome shaped sample and an outer surface of the hollow dome shaped shell, and the inner surface of the dome shaped sample and the outer surface of the hollow dome shaped shell form a good gas guiding effect, which is beneficial to the discrete and uniform movement of the gas.

4. Uniformly Distributed Gas Extraction Structure:

A reaction tail gas is collected by the gas extraction plate and then discharged from the cabin. A circle of gas extraction holes with uniform diameter are uniformly distributed on a side wall of the gas extraction plate, which can achieve synchronous gas extraction in a 360° direction, thus further improving the uniformity of the flow field. And the uniformly distributed gas extraction plate is located below a lower edge of the dome shaped sample to be away from the sample, thus achieving far-end gas extraction and reducing the disturbance of a flow field near the gas extraction port on the uniform coating.

5. Internal and External Synchronous Radiative Heating Structure

The dome shaped heater is used to heat the sample from the outside, the disc heater is used to heat three components of the hollow dome shaped shell, the cover plate and the gas extraction plate, the high-temperature thermal radiation of the hollow dome shaped shell is used to heat the sample from the inside, and the annular heater is used to heat an upper portion of the sample support to prevent heat flow loss. Through internal and external bidirectional heating, the temperature gradient of the sample is reduced to achieve a more uniform and stable temperature field, thus satisfying the higher requirements of the ALD for a temperature field and improving the quality of the film layer.

By designing and optimizing the cabin structure of the ALD equipment, uniform coating on the inner surface of the dome shaped surface is achieved, and photoelectric thin films, such as $TiO_2$, $Al_2O_3$, $SiO_2$, $In_2O_3$ and $SnO_X$, can be deposited on substrates such as glass, quartz, sapphire, a silicon wafer, and polymer, with good uniformity. The present disclosure solves the long-standing problems in the field of film coating, fills the technical blanks in China and other countries in the field of ALD, and plays an active role in promoting the production of the ALD equipment in China and the ALD technology in China to catch up with the international advanced level.

The atomic layer deposition device of the present disclosure achieves the following beneficial effects:

1. For the traditional evaporation and magnetron sputtering coating technologies, there is a certain regularity in the density distribution of particles of a coating material in the cabin space, and uniform distribution in the space cannot be achieved. In contrast, all reactive particles in the ALD coating process exist in the cabin in a gaseous state, making the spatial distribution more uniform, so the uniform deposition of a thin film can be achieved by making full use of the free diffusion characteristics of gas in space. However, the complete dependence on the free diffusion characteristics of gas has the disadvantage of poor controllability, and it is more beneficial to achieve gas flow control through certain technical means. The uniform diffusion characteristic of the gas in the ALD is fully used to achieve active guidance and control of the gas movement path and the gas flow field through a special structural design. By actively controlling the gas flow state, a more stable and uniform gas flow field can be achieved, which is more suitable for the uniform coating of the dome shaped surface.

2. When the traditional evaporation and magnetron sputtering coating technologies are used for the coating of the curved surface, it is usually necessary to design a special sample support, or even a complex target-substrate linkage mechanism. Due to the limitation of the radius of the curved surface, the traditional evaporation and magnetron sputtering coating technologies can only be applied to the coating on the inner surfaces of samples with simple shape, such as a dome shaped sample or a spherical-segment sample with a large-curved surface radius, and it is impossible to carry out the uniform coating on the inner surface of a deep-arched sample and other samples with large aspect ratios. Usually, the equipment has complex structure, high cost and many limitations and is greatly limited in the scope of application. In comparison, the ALD equipment provided by the present disclosure has simple structure and low manufacturing cost. For dome shaped samples with different curved-surface radiuses, there is no need to redesign the structure, and the uniform coating on the inner surface of the dome shaped surface with any curved-surface radius can be achieved by only simply replacing the hollow dome shaped shell, the cover plate, the gas extraction plate, the base heater and the sample support with different sizes. Furthermore, by replacing the hollow dome shaped shell with other curved surfaces such as spherical segment or deep arch, the ALD equipment provided by the present disclosure can be popularized and applied to the uniform deposition of thin films on the inner surface of the spherical-segment or deep-arched curved surface.

3. By designing an internal and external synchronous radiative heater structure, the dome shaped sample is innovatively sandwiched between two heat radiation sources, and the sample is synchronously heated by a bidirectional radiation heat exchange method, thus improving the defects of large temperature gradient and poor temperature uniformity caused by radiation heating of a single heat source under vacuum conditions. The uniformity of the temperature field is significantly improved, and the temperature gradient of the sample is reduced. The internal and external synchronous radiative heater structure plays a key role in improving the quality of the ALD film layer.

4. The present disclosure is not only limited to uniform coating on the inner surface of the dome shaped sample, but also can be used for the uniform coating on the inner surface of deep-arched curved surface by modifying the dome shaped shells with arbitrary fixed curved-surface radius into deep-arched parts with arbitrary continuous variable curved-surface radius, with small technical migration resistance, wide popularization and application range and great application potential.

DETAILED DESCRIPTION OF THE EMBODIMENTS

Figure 1:
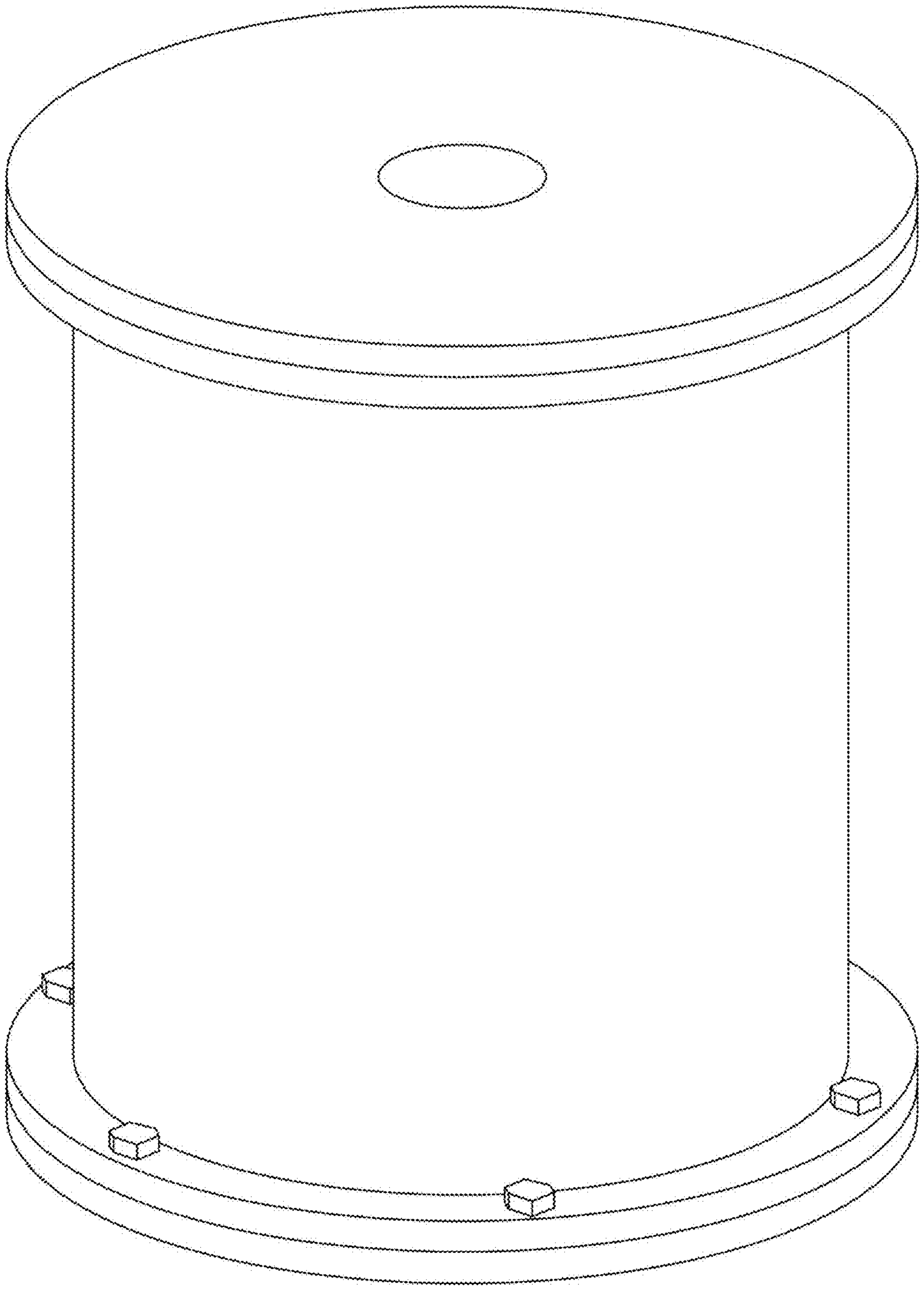
FIG. 1 is a schematic diagram of an external structure of an atomic layer deposition device for uniform coating on an inner surface of a dome shaped surface according to the present disclosure.
Figure 2:
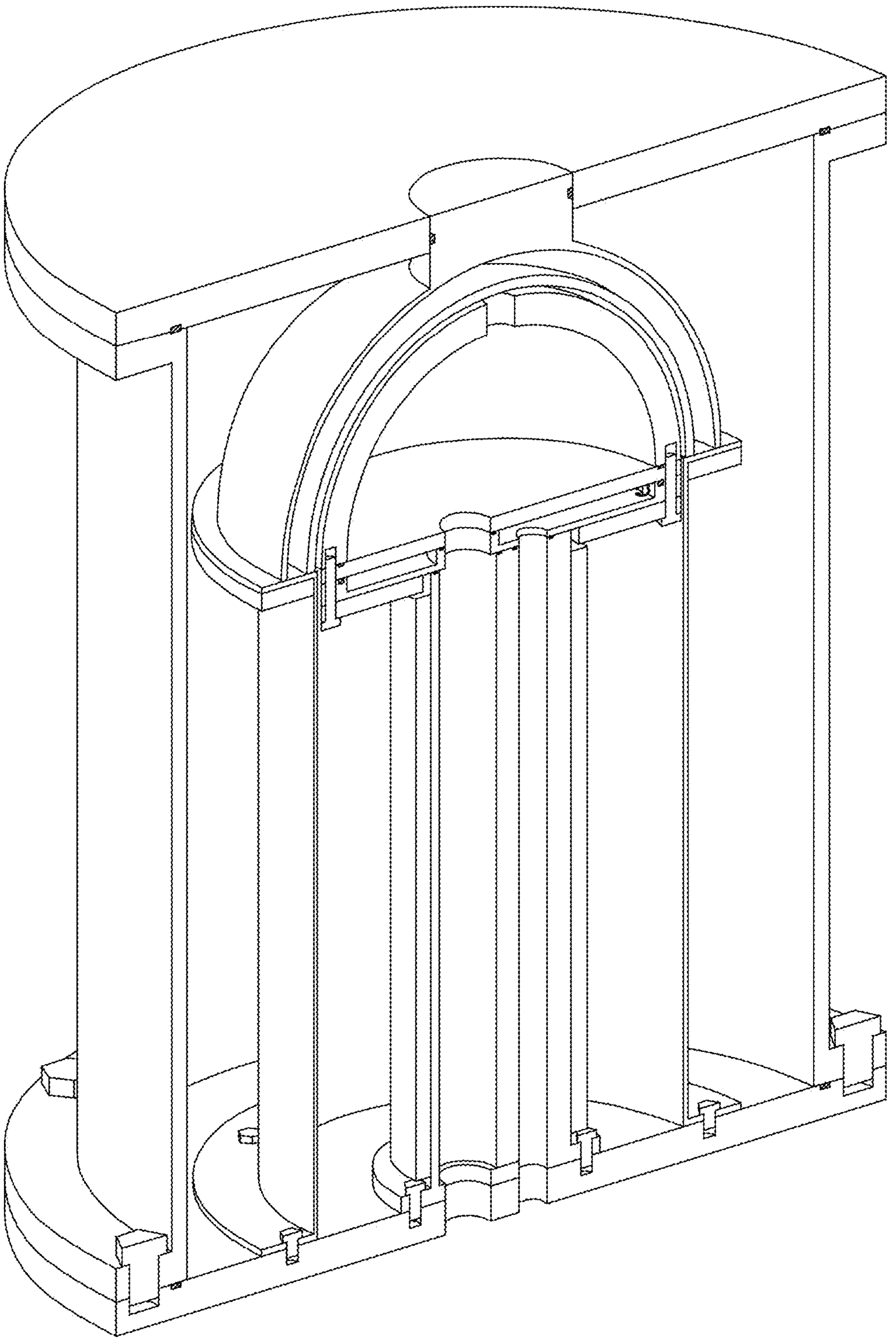
FIG. 2 is a three-dimensional schematic diagram of an internal structure of the atomic layer deposition device for uniform coating on the inner surface of the dome shaped surface according to the present disclosure.
Figure 3:
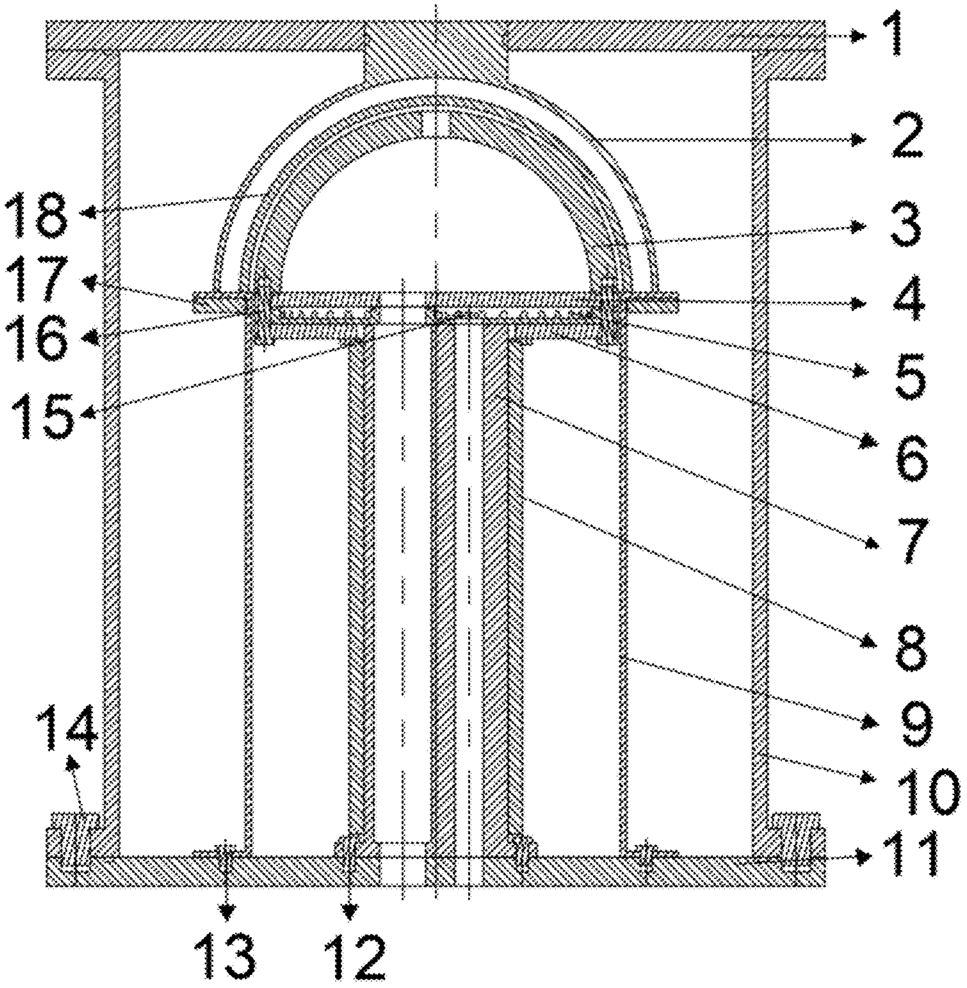
FIG. 3 is a planar schematic diagram of the internal structure of the atomic layer deposition device for uniform coating on the inner surface of the dome shaped surface according to the present disclosure.

Specific implementation 1: An atomic layer deposition device for uniform coating on an inner surface of a dome shaped surface in this implementation includes a cabin cover 1, a dome shaped heater 2, a hollow dome shaped shell 3, a cover plate 4, a gas extraction plate 5, a disc heater 6, a gas channel member 7, a cylindrical heater 8, a sample support 9, a cabin 10, and a cabin base 11. A first gas inlet 11-1 and a first gas outlet 11-2 are formed in the cabin base 11. The gas channel member 7 is cylindrical, a gas inlet passage 7-1 and a gas outlet passage 7-2 are formed in the gas channel member 7 along an axial direction of the gas channel member 7. The gas channel member 7 is vertically fixed to an upper surface of the cabin base 11, the gas inlet passage 7-1 in the gas channel member 7 is in communication with the first gas inlet 11-1, and a gas outlet passage 7-2 in the gas channel member 7 is in communication with the first gas outlet 11-2. The cylindrical heater 8 is sleeved outside the gas channel member 7.

The gas extraction plate 5 is disc-shaped, a peripheral edge 5-3 is formed on an upper surface of the gas extraction plate 5 in a circumferential direction of the gas extraction plate 5, multiple gas holes 5-4 are formed in the peripheral edge 5-3 in a radial direction of the peripheral edge 5-3, and the multiple gas holes 5-4 are uniformly distributed in the circumferential direction of the gas extraction plate 5. A second gas inlet 5-1 and a second gas outlet 5-2 are formed in the gas extraction plate 5, a flange 5-5 is arranged on a circumference of the second gas inlet 5-1, and an upper surface of the peripheral edge 5-3 and an upper surface of the flange 5-5 are flush with each other. The cover plate 4 covers the gas extraction plate 5 and is fixed to the gas extraction plate 5. A third gas inlet 4-1 is formed in the cover plate 4, and in communication with the second gas inlet 5-1. A gas cavity is enclosed by the peripheral edge 5-3, the flange 5-5 and the cover plate 4.

The gas extraction plate 5 is fixed to an upper surface of the gas channel member 7, the second gas inlet 5-1 is in communication with the gas inlet passage 7-1 in the gas channel member 7, and the second gas outlet 5-2 is in communication with the gas outlet passage 7-2 in the gas channel member 7. The disc heater 6 is arranged on a lower surface of the gas extraction plate 5, the hollow dome shaped shell 3 is fixed to an upper surface of the cover plate 4, and a central gas hole 3-1 is formed in a center of the hollow dome shaped shell 3.

The sample support 9 is mounted on the cabin base 11, and sleeved outside the gas channel member 7. An annular platform 9-1 is formed on a top of the sample support 9, and a dome shaped sample 18 is placed on the annular platform 9-1 and is located above and covers the hollow dome shaped shell 3. A ventilation gap is arranged between the dome shaped sample 18 and the hollow dome shaped shell 3, and a further ventilation gap is arranged between the sample support 9 and the cover plate 4 as well as the gas extraction plate 5.

The cabin 10 is mounted on the cabin base 11, and sleeved outside the sample support 9. A top of the cabin 10 is covered with the cabin cover 1, the dome shaped heater 2 is arranged on a lower surface of the cabin cover 1, and the dome shaped heater 2 covers an upper portion of the dome shaped sample 18.

This implementation puts forward ALD equipment suitable for uniform coating on the inner surface of the dome shaped surface. By optimizing the cabin structure, a stable temperature field and flow field distribution is achieved, and uniform coating on the inner and outer surfaces is achieved. The equipment structure, after being slightly modified, can be widely applied to the uniform coating on the inner and outer surfaces of conformal curved surfaces such as a spherical segment and a deep arch. The present disclosure provides a solution for achieving uniform coating on the inner and outer surfaces of the dome shaped surface by the ALD technology.

Specific implementation 2: the difference between this implementation and the specific implementation 1 is that the cabin base 1 is disc-shaped.

Specific implementation 3: the difference between this implementation and the specific implementation 1 or 2 is that the gas channel member 7 is fixedly connected to the cabin base 1 by multiple first bolts 12.

Specific implementation 4: the difference between this implementation and one of the specific implementations 1 to 3 is that a diameter of the gas inlet passage 7-1 is greater than a diameter of the gas outlet passage 7-2.

Specific implementation 5: the difference between this implementation and one of the specific implementations 1 to 4 is that the gas extraction plate 5 is fixed to an upper surface of the gas channel member 7 by multiple fourth bolts 15.

Specific implementation 6: the difference between this implementation and one of the specific implementations 1 to 5 is that the hollow dome shaped shell 3, the cover plate 4, the gas extraction plate 5 and the disc heater 6 are connected through multiple fifth bolts 16.

Specific implementation 7: the difference between this implementation and one of the specific implementations 1 to 6 is that the ventilation gap between the dome shaped sample 18 and the hollow dome shaped shell 3 has a width of 1 mm-2 mm.

Specific implementation 8: the difference between this implementation and one of the specific implementations 1 to 7 is that the lower surface of the cabin cover 1 is in threaded connection with the dome shaped heater 2.

Specific implementation 9: the difference between this implementation and one of the specific implementations 1 to 8 is that the hollow dome shaped shell 3 is replaced with a deep-arched dome shaped shell 3-1.

The deep-arched dome shaped shell 3-1 is used in this implementation to be suitable for a deep-arched sample 18-1.

Specific implementation 10: the difference between this implementation and one of the specific implementations 1 to 9 is that an annular heater 17 is arranged on a lower surface of the annular platform 9-1.

Embodiment: An atomic layer deposition device for uniform coating on an inner surface of a dome shaped surface in this embodiment includes a cabin cover 1, a dome shaped heater 2, a hollow dome shaped shell 3, a cover plate 4, a gas extraction plate 5, a disc heater 6, a gas channel member 7, a cylindrical heater 8, a sample support 9, a cabin 10, and a cabin base 11. A first gas inlet 11-1 and a first gas outlet 11-2 are formed in the cabin base 11. The gas channel member 7 is cylindrical, and is provided with a gas inlet passage 7-1 and a gas outlet passage 7-2 in an axial direction of the gas channel member 7. A diameter of the gas inlet passage 7-1 is twice that of the gas outlet passage 7-2. The bottom of the gas channel member 7 is vertically fixed to an upper surface of the cabin base 11 by multiple first bolts 12, the gas inlet passage 7-1 in the gas channel member 7 is in communication with the first gas inlet 11-1, and a gas outlet passage 7-2 in the gas channel member 7 is in communication with the first gas outlet 11-2. The cylindrical heater 8 is sleeved outside the gas channel member 7.

The gas extraction plate 5 is disc-shaped, a peripheral edge 5-3 is formed on an outer edge of an upper surface of the gas extraction plate 5 in a circumferential direction of the gas extraction plate 5, multiple gas holes 5-4 are formed in the peripheral edge 5-3 in a radial direction of the peripheral edge 5-3, and the multiple gas holes 5-4 are uniformly distributed in a circumferential direction of the gas extraction plate 5. A second gas inlet 5-1 and a second gas outlet 5-2 are formed in the gas extraction plate 5, a flange 5-5 is arranged on the circumference of the second gas inlet 5-1, and upper surfaces of the peripheral edge 5-3 and the flange 5-5 are flush with each other. The cover plate 4 covers the gas extraction plate 5 and is fixed to the gas extraction plate 5. A third gas inlet 4-1 is formed in the cover plate 4, and in communication with the second gas inlet 5-1. A gas cavity is enclosed by the peripheral edge 5-3, the flange 5-5 and the cover plate 4.

The gas extraction plate 5 is fixed to an upper surface of the gas channel member 7 by multiple fourth bolts 15, the second gas inlet 5-1 is in communication with the gas inlet passage 7-1 in the gas channel member 7, and the second gas outlet 5-2 is in communication with the gas outlet passage 7-2 in the gas channel member 7. The disc heater 6 is arranged on a lower surface of the gas extraction plate 5, the hollow dome shaped shell 3 is fixed to an upper surface of the cover plate 4, and a central gas hole 3-1 is formed in the center of the hollow dome shaped shell 3. The hollow dome shaped shell 3, the cover plate 4, the gas extraction plate 5 and the disc heater 6 are connected by multiple fifth bolts 16, and the multiple fifth bolts 16 are arranged in a circumferential direction.

The bottom of the sample support 9 is mounted on the cabin base 11 by multiple second bolts 13. The sample support 9 is cylindrical and sleeved outside the gas channel member 7. The top of the sample support 9 is provided with an annular platform 9-1, and an annular heater 17 is arranged on a lower surface of the annular platform 9-1. A dome shaped sample 18 is placed on the annular platform 9-1 and is located above and covers the hollow dome shaped shell 3. A ventilation gap is arranged between the dome shaped sample 18 and the hollow dome shaped shell 3, and a further ventilation gap is arranged between the sample support 9 and the cover plate 4 as well as the gas extraction plate 5.

The bottom of the cabin 10 is mounted on the cabin base 11 by multiple third bolts 14, and the cabin 10 is sleeved outside the sample support 9. The top of the cabin 10 is covered with the cabin cover 1, a dome shaped heater 2 is arranged on a lower surface of the cabin cover 1, and the dome shaped heater 2 covers an upper portion of the dome shaped sample 18.

In this embodiment, the top of the dome shaped heater 2 is embedded into the cabin cover 1 and detachably connected to the cabin cover 1 by threads, and a sealing ring is used at a joint for vacuum sealing. The disc heater 6, the gas extraction plate 5, the cover plate 4 and the hollow dome shaped shell 3 are tacked and placed from bottom to top in sequence, and the second gas inlet 5-1 of the gas extraction plate 5 is aligned with the third gas inlet 4-1 of the cover plate 4. Uniformly distributed through holes with consistent diameter are formed in the disc heater 6, the gas extraction plate 5 and the cover plate 4 in the same radial dimension, and threaded holes are formed at the same radial dimension position as the above through holes in the hollow dome shaped shell 3. By using the fifth bolts 16 and the threaded holes in the hollow dome shaped shell 3, the disc heater 6, the gas extraction plate 5, the cover plate 4 and the hollow dome shaped shell 3 are fastened by the fifth bolts 16, and sealing rings are used at joints of the parts to achieve vacuum sealing, and there is no sealing ring placed between the disc heater 6 and the gas extraction plate 5.

The gas inlets and gas outlets of the gas extraction plate 5 and the gas channel member 7 are respectively aligned with each other, the gas extraction plate 5 and the gas inlet channel 7 are fastened by the fourth bolts 15, and a joint is sealed with a sealing ring. The gas channel member 7, the sample support 9 and the cabin 10 are coaxially arranged.

A working mode of the ALD is cyclic alternating reaction. Taking the scene where two precursors participate in the reaction as an example, a complete cycle includes four steps: feeding precursors, cleaning, feeding precursors, and cleaning. Feeding precursors-cleaning is a complete half-cycle reaction. The precursor enters the cabin in a gaseous state to perform adsorption and reaction on a surface of a substrate, and generates byproducts. The function of the cleaning step is to discharge excess precursors and reaction byproducts to prepare for the next half-cycle reaction. Two complete half-cycles form a complete cycle to achieve once deposition. The working principles and modes of the two half-cycles are similar, so the working principle of the invention is described by taking one half-cycle as an example.

Figure 4:
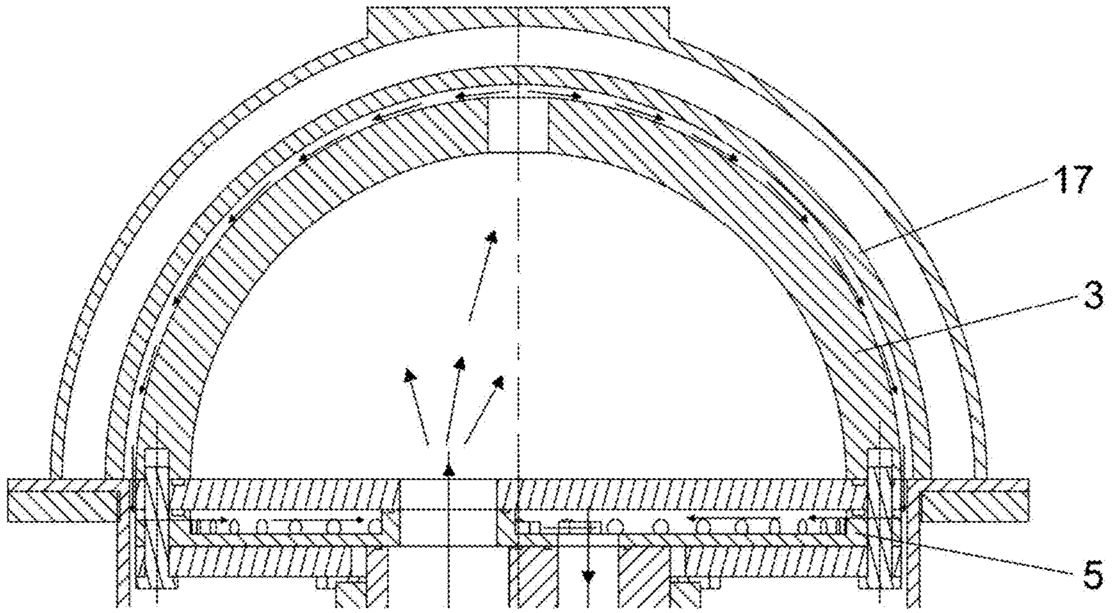
FIG. 4 is a diagram of working principle of gas flow in the atomic layer deposition device for uniform coating on the inner surface of the dome shaped surface according to the present disclosure.
Figure 5:
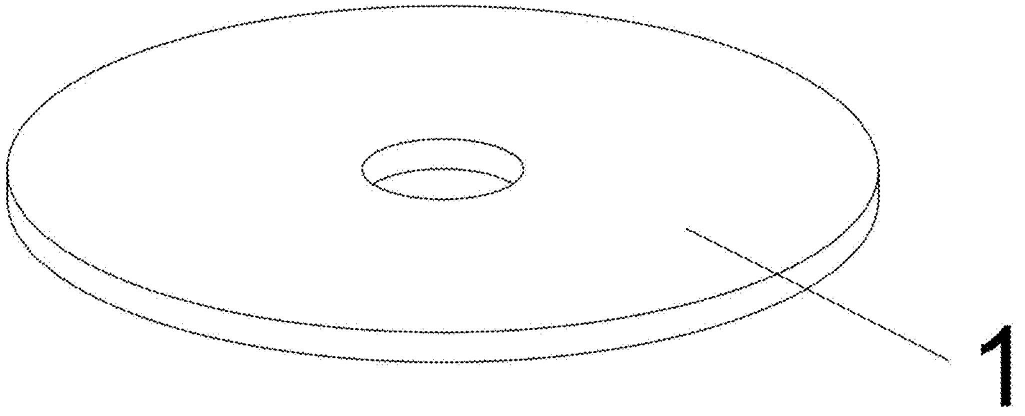
FIG. 5 is a structural diagram of a cabin cover.
Figure 6:
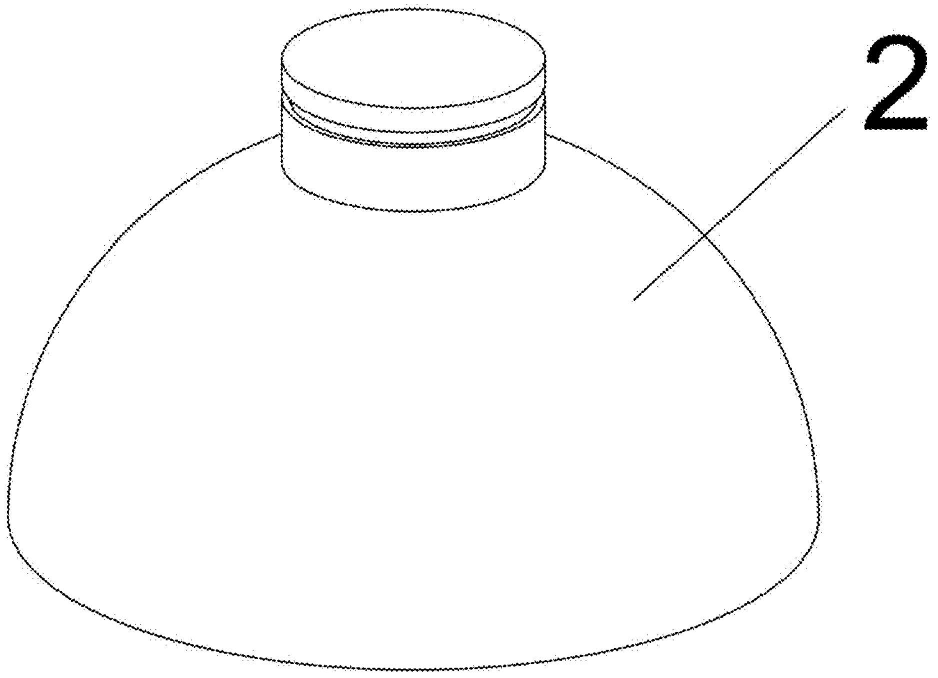
FIG. 6 is a structural diagram of a dome shaped heater.
Figure 7:
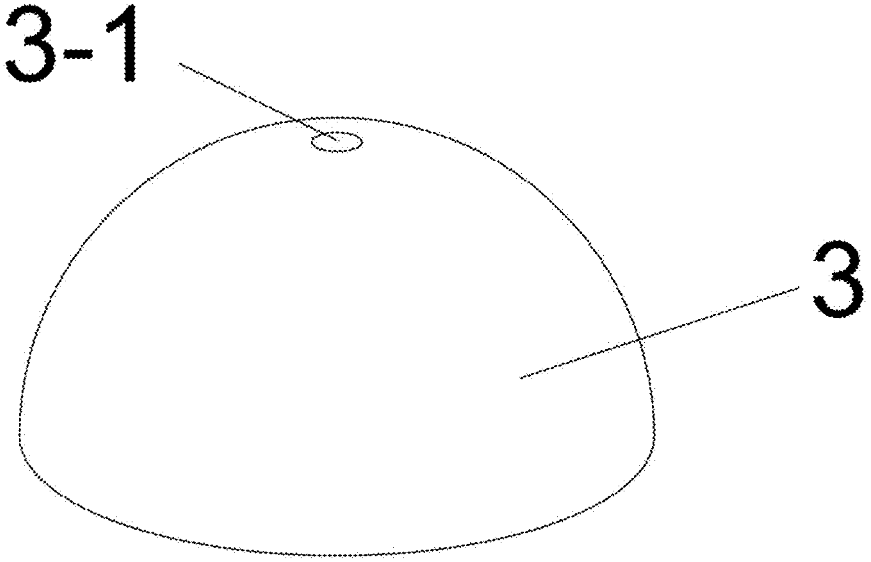
FIG. 7 is a structural diagram of a hollow dome shaped shell.
Figure 8:
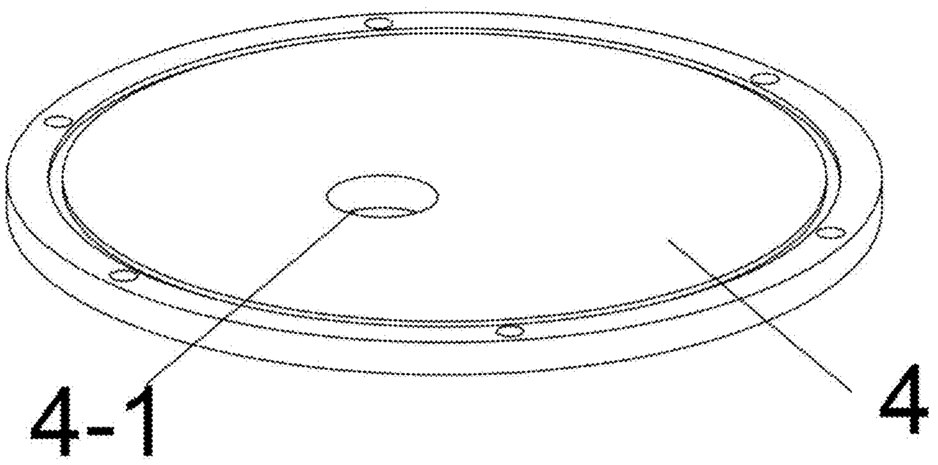
FIG. 8 is a structural diagram of a cover plate.
Figure 9:
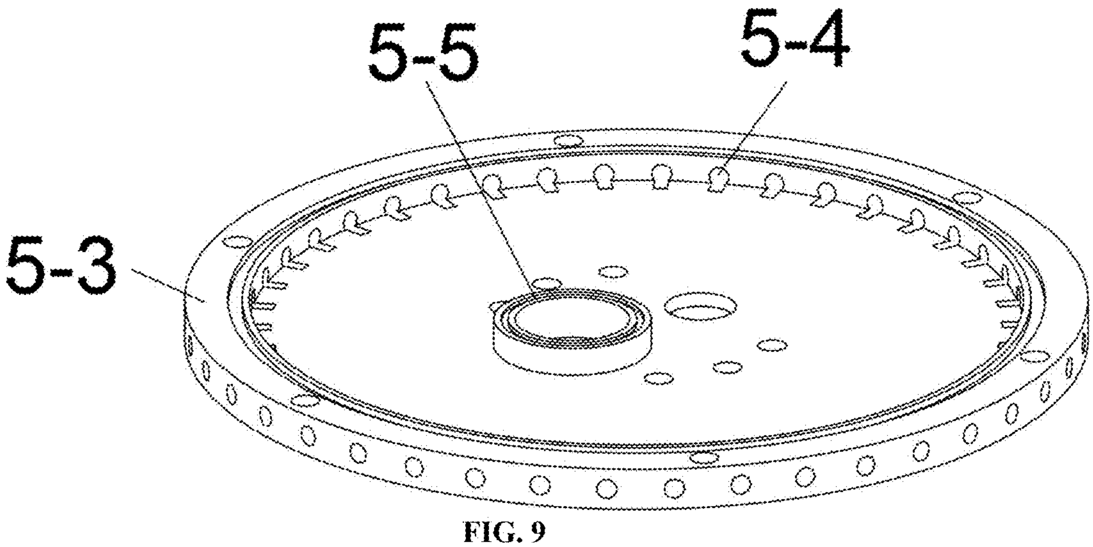
FIG. 9 is a structural diagram of a gas extraction plate.
Figure 10:
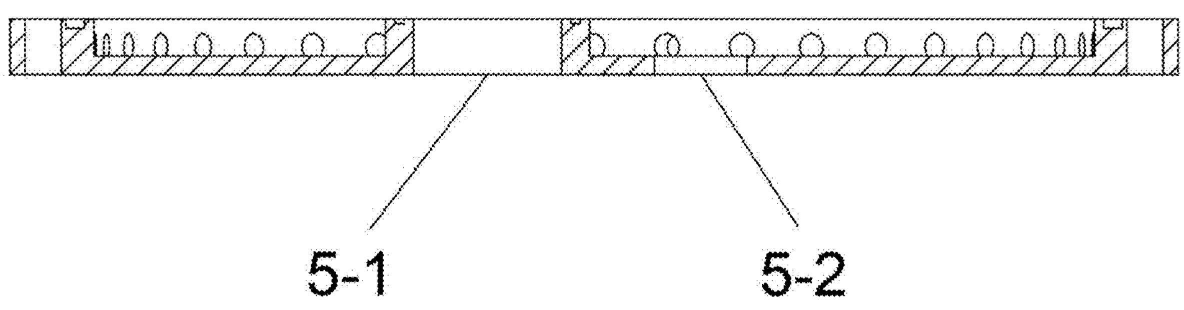
FIG. 10 is a sectional diagram of the gas extraction plate.
Figure 11:
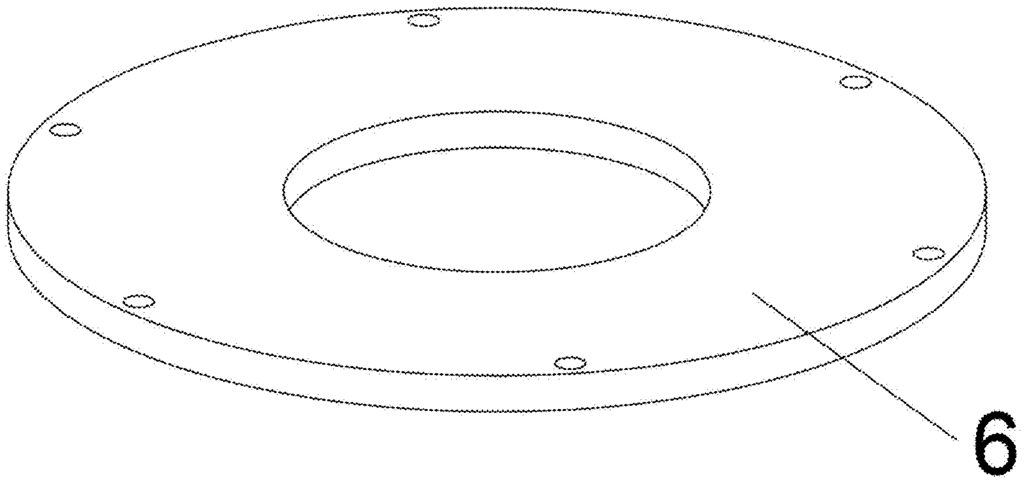
FIG. 11 is a structural diagram of a disc heater.
Figure 12:
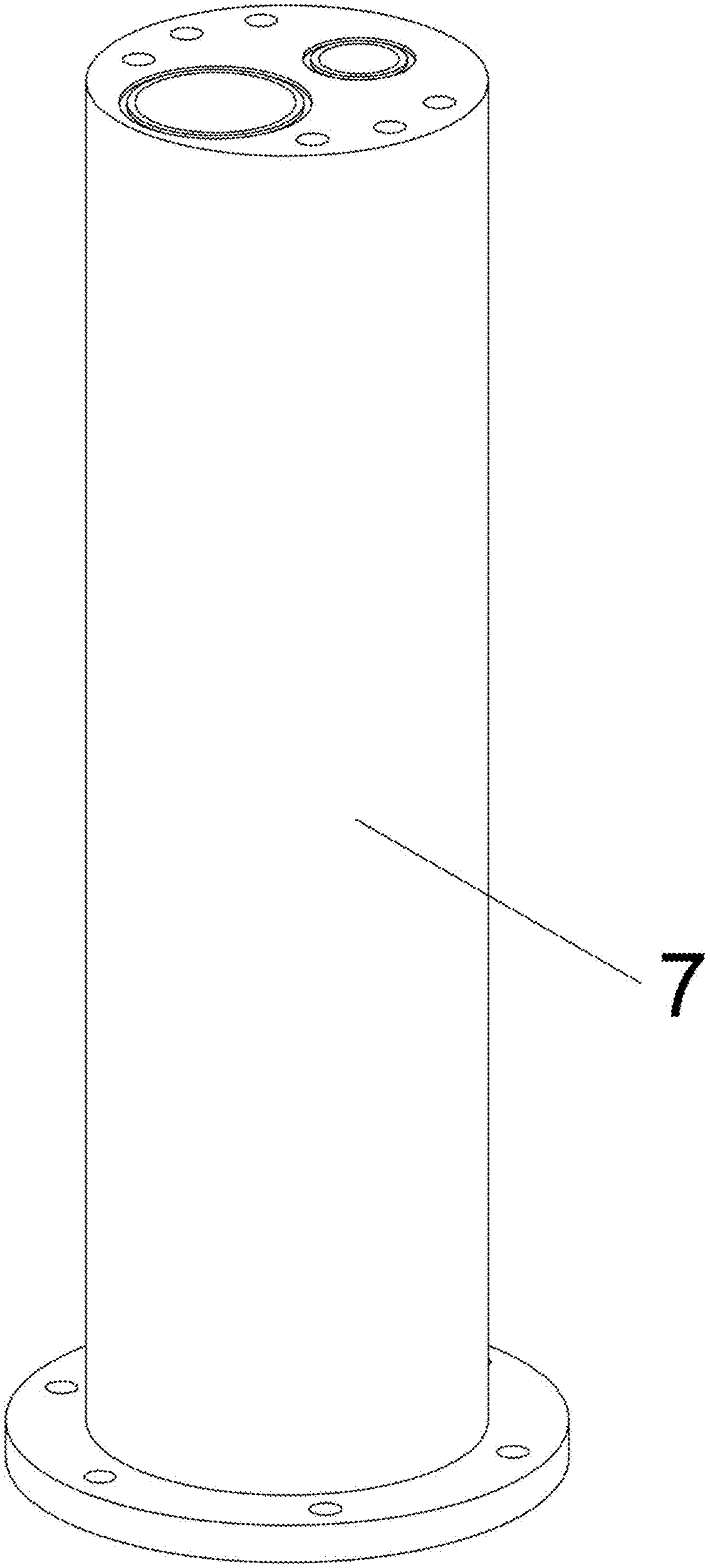
FIG. 12 is a structural diagram of a gas channel member.
Figure 13:
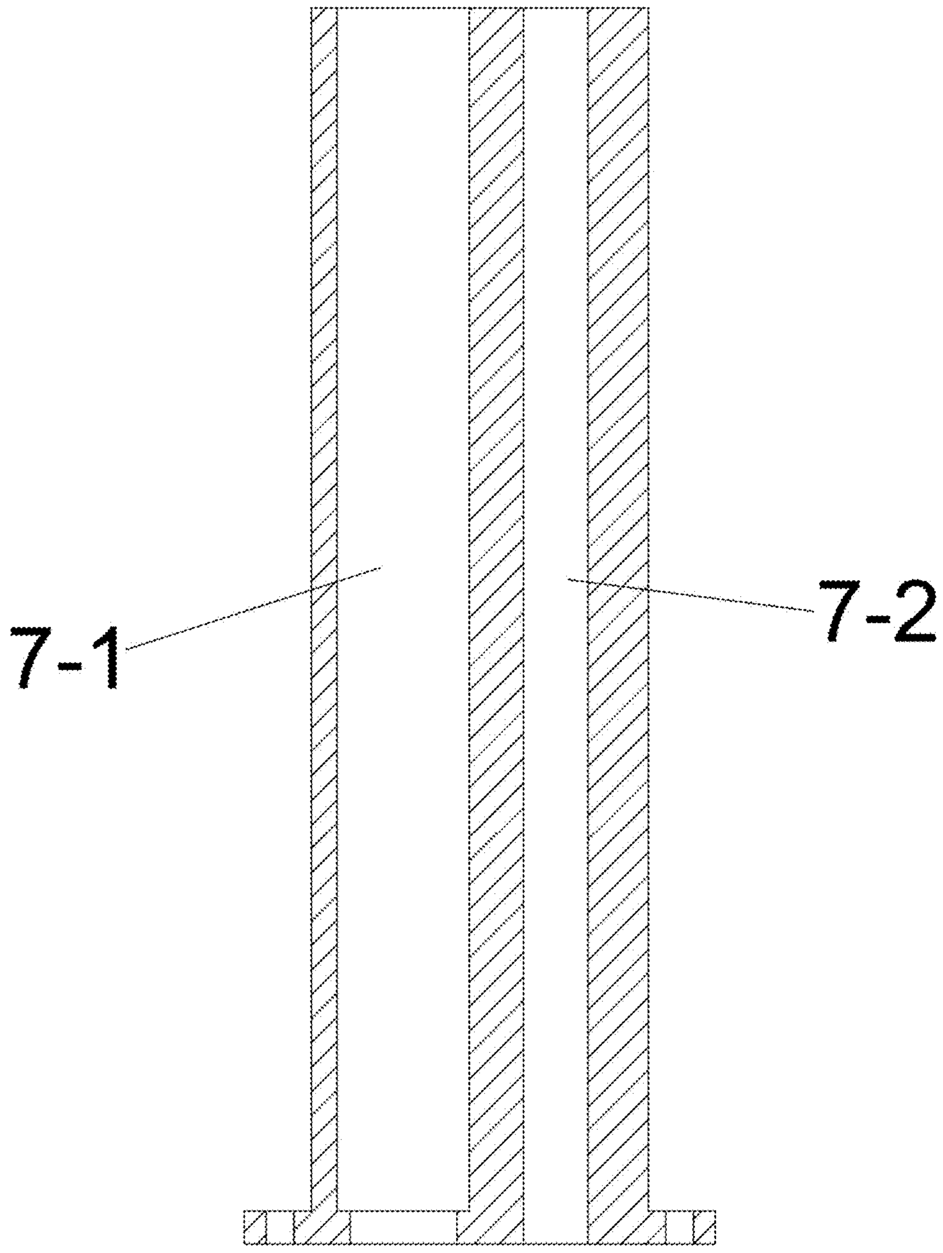
FIG. 13 is a sectional diagram of a gas channel member.
Figure 14:
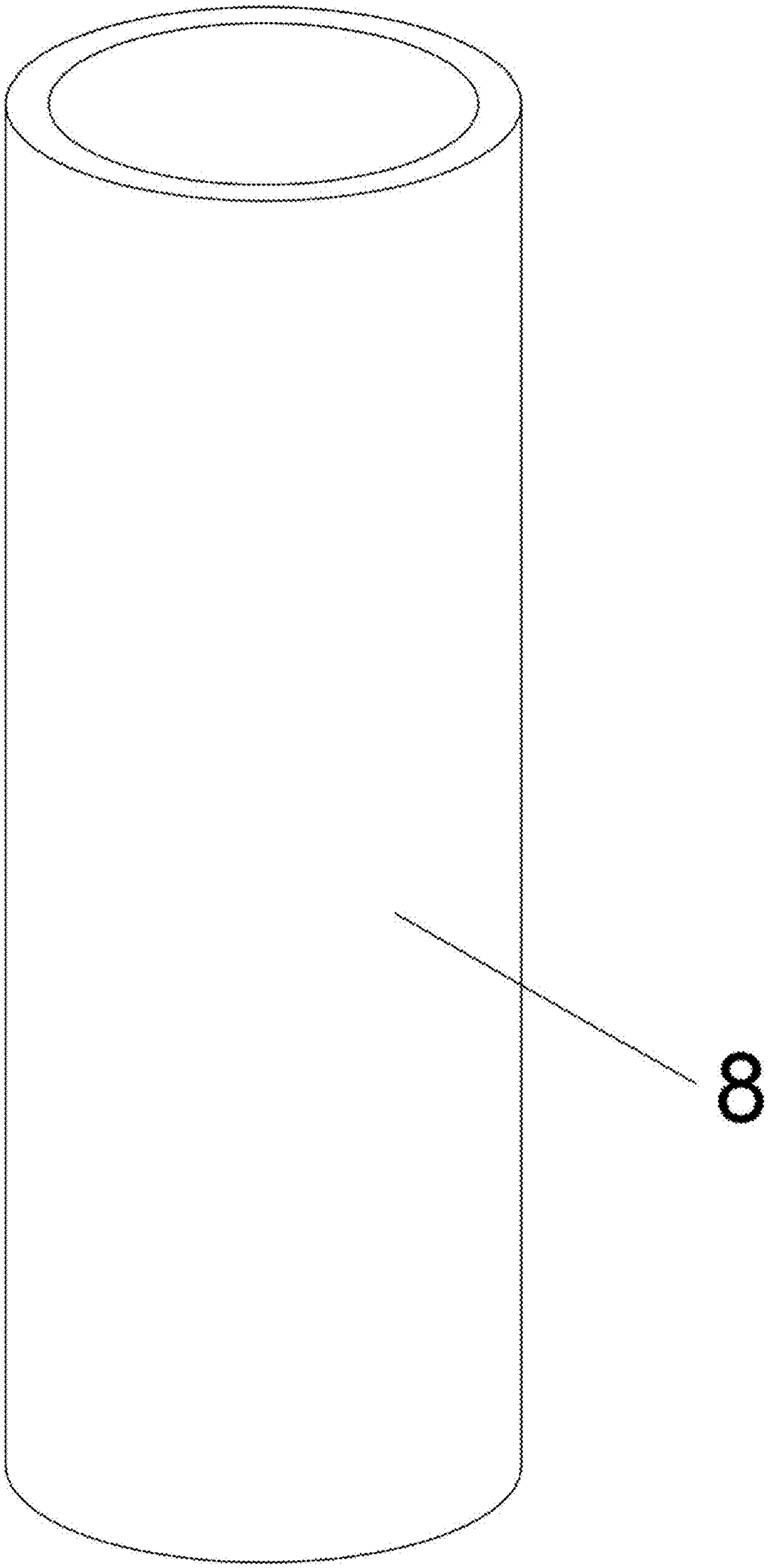
FIG. 14 is a structural diagram of a cylindrical heater.
Figure 15:
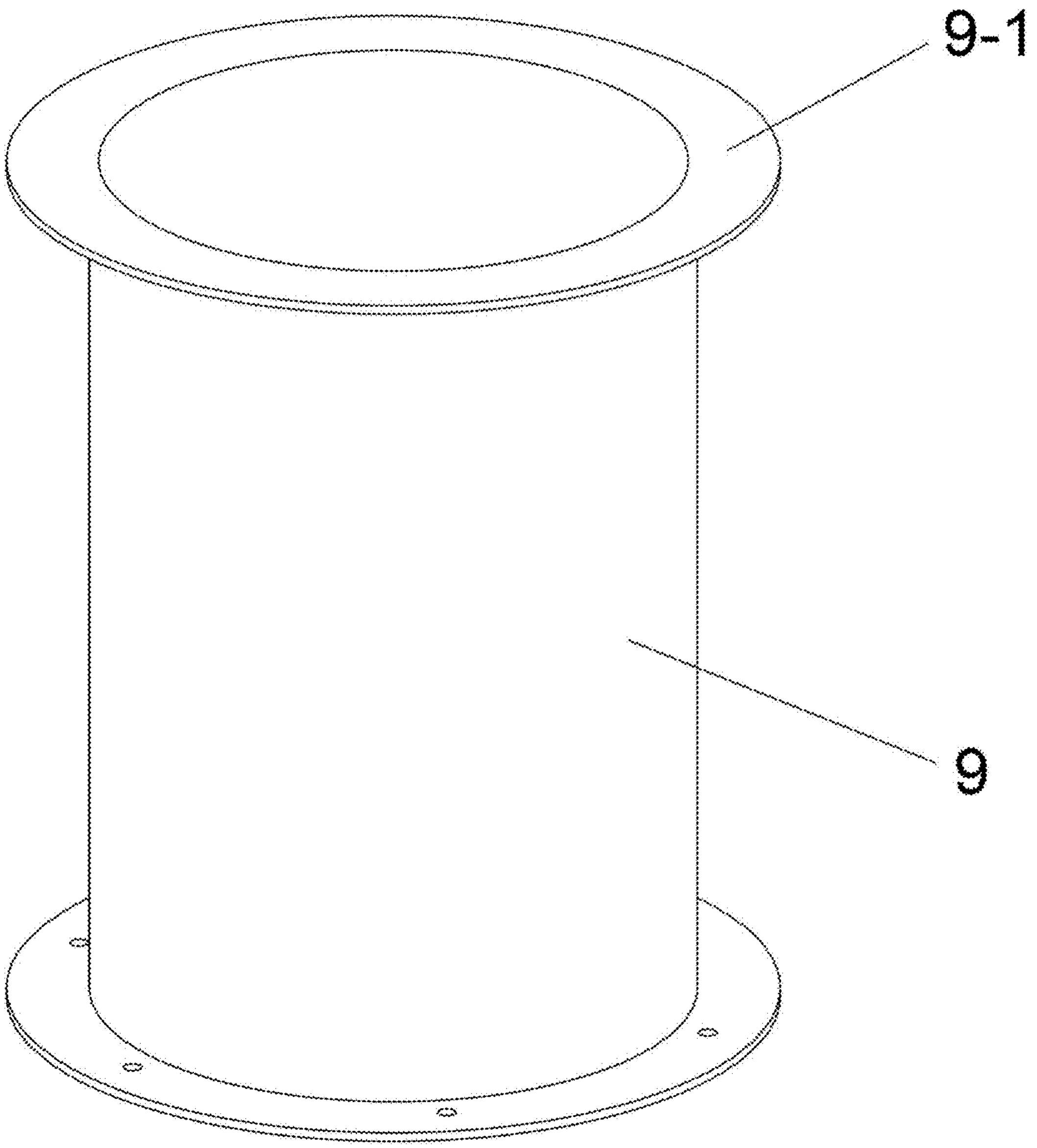
FIG. 15 is a structural diagram of a sample support.
Figure 16:
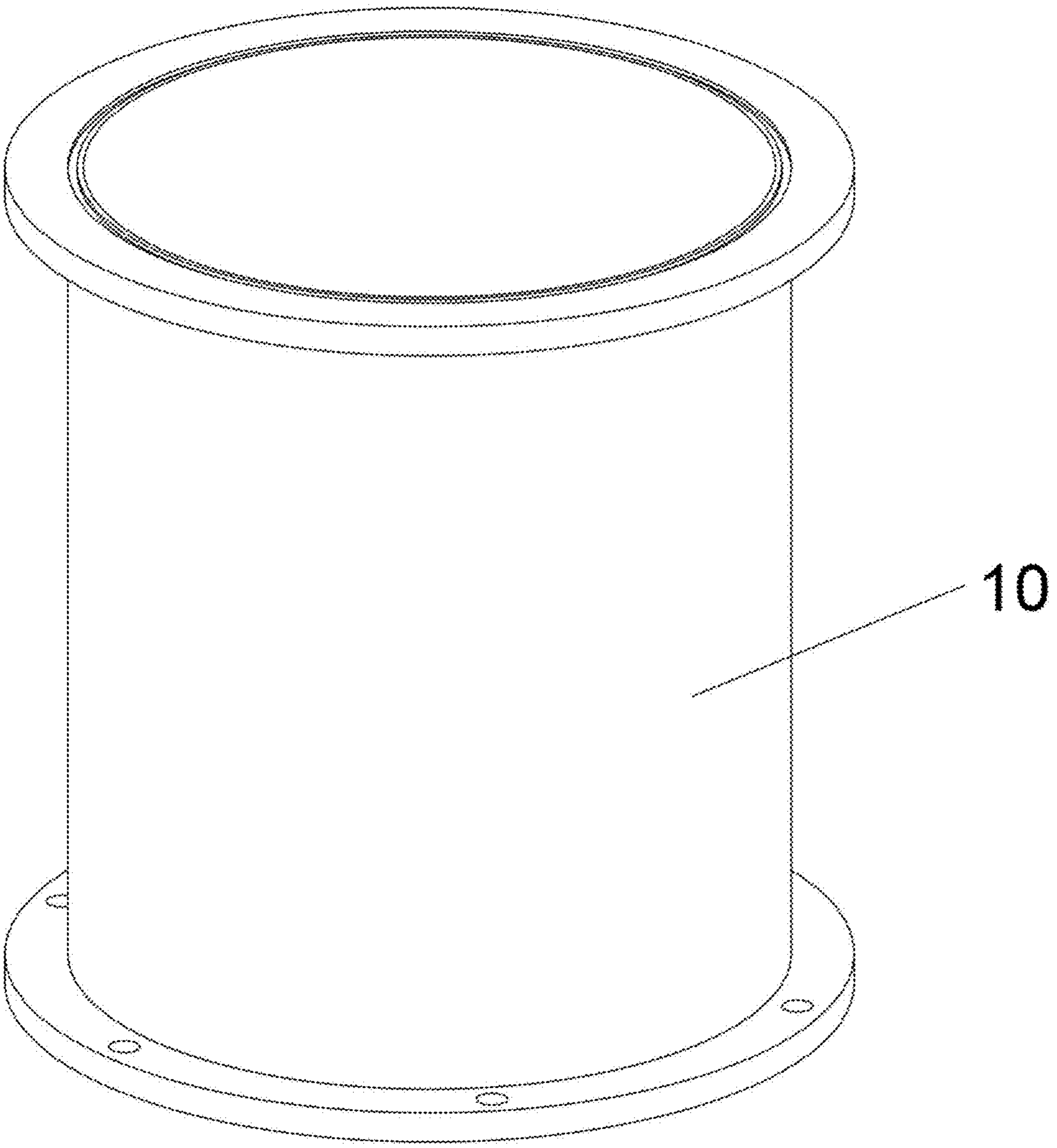
FIG. 16 is a structural diagram of a cabin.
Figure 17:
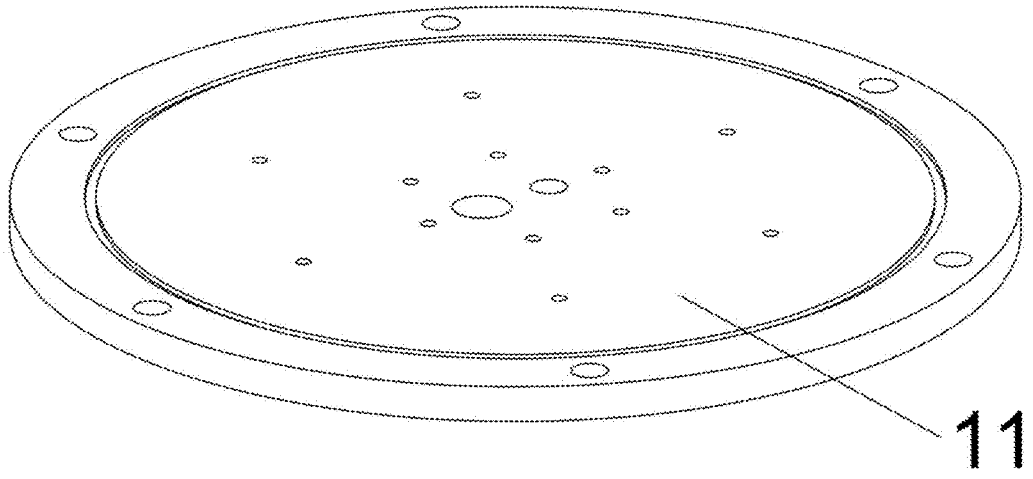
FIG. 17 is a structural diagram of a cabin base.
Figure 18:
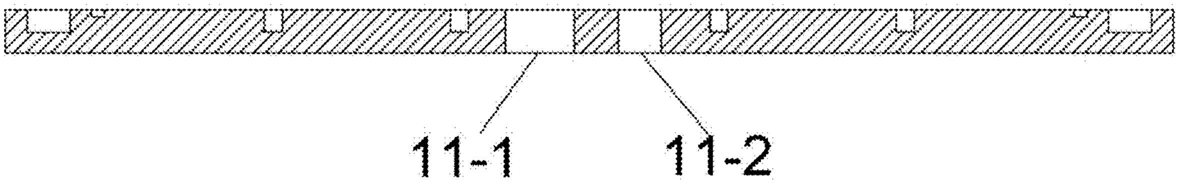
FIG. 18 is a sectional diagram of a cabin base.
Figure 19:
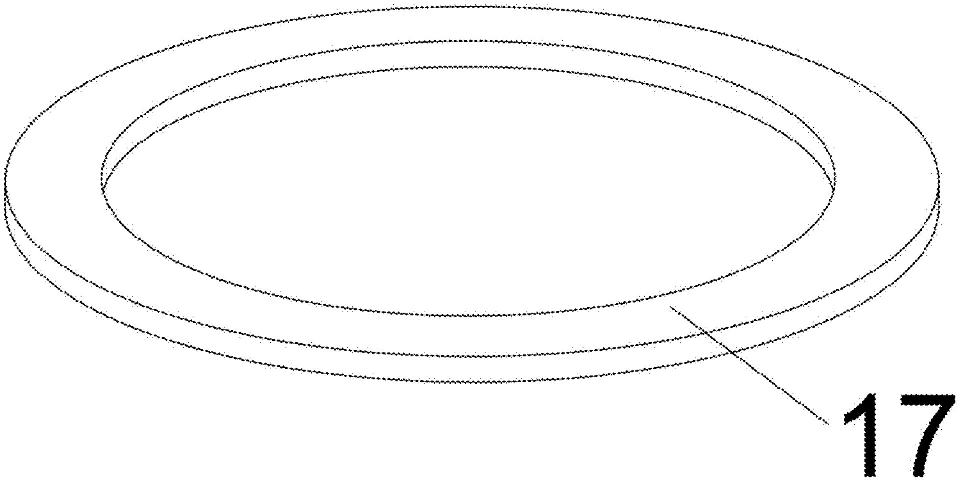
FIG. 19 is a structural diagram of an annular heater.
Figure 20:
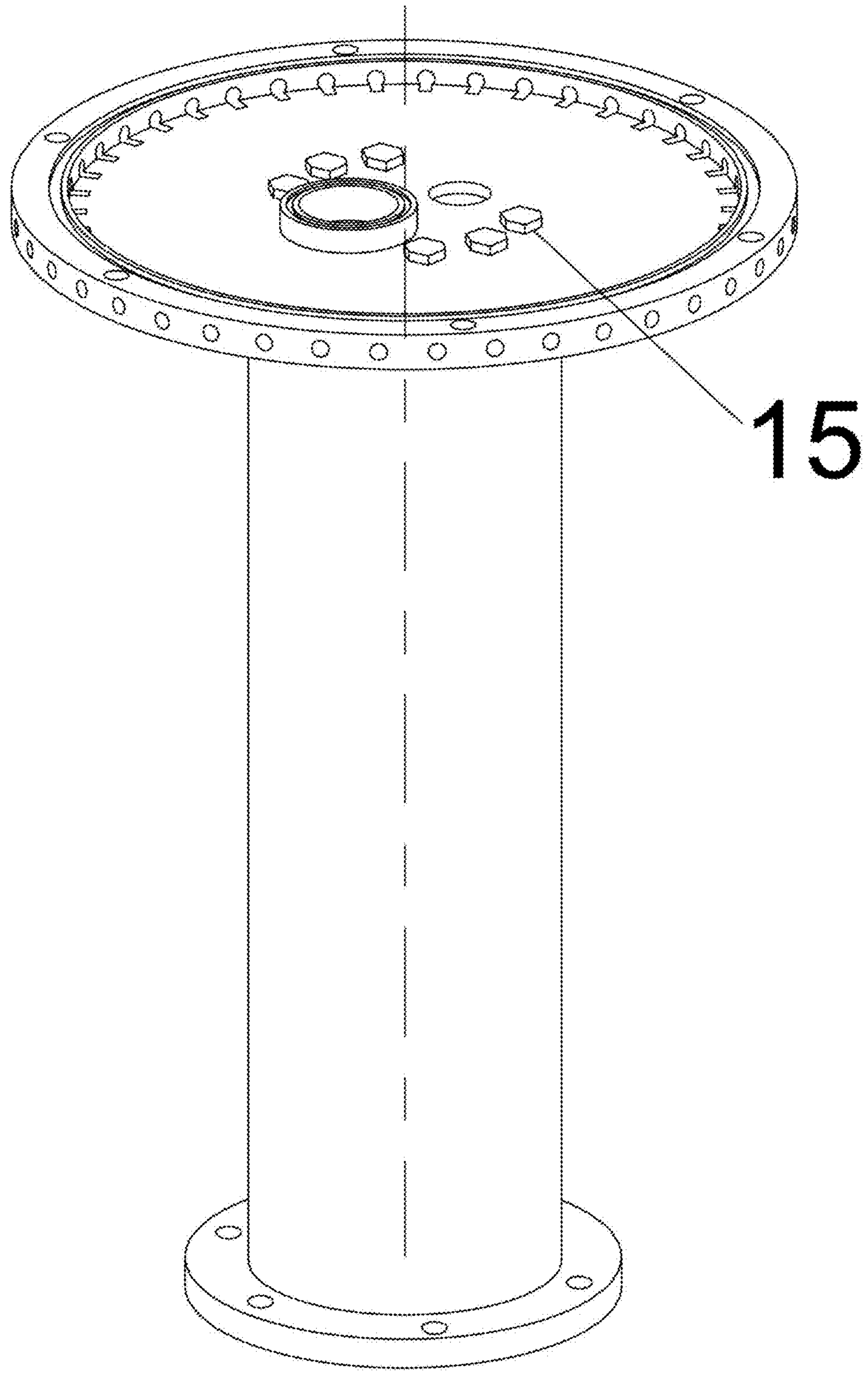
FIG. 20 is a diagram of the gas extraction plate and the gas channel member connected together.
Figure 21:
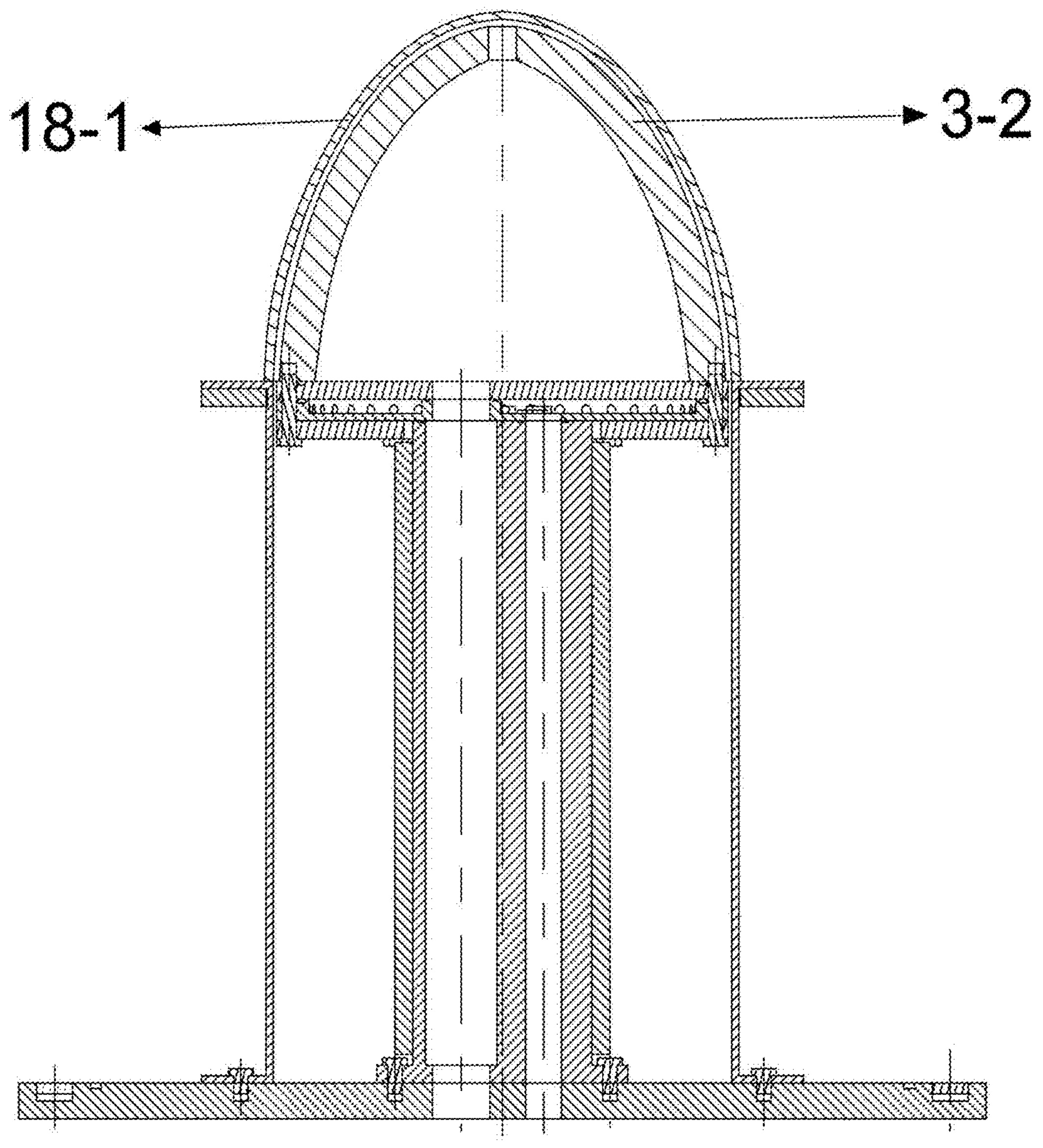
FIG. 21 is a structural diagram of a deep-arched dome shaped shell in a specific embodiment 10.

The working principle diagram of the ALD equipment provided by the present disclosure is as shown in FIG. 4. A position of the dome shaped sample 18 in the figure shows a placement position and mode of a sample in a coating state. The working mode and working principle are as follows:

1. Sample Placement:

The dome shaped sample 18 is placed above the sample support 9 according to a placement mode shown in the figure, and the cabin is evacuated to a vacuum condition required by an experiment through a vacuum pump.

2. Heating:

The dome shaped heater 2 is used to heat the dome shaped sample from above, and the annular heater 17 is used to heat an upper portion of the sample support 9.

The disc heater 6 is used to heat three components of the hollow dome shaped shell 3, the cover plate 4 and the gas extraction plate 5, and the sample is heated from inside using the heat radiation of the hollow dome shaped shell 3. Therefore, a more uniform and stable temperature field is achieved through internal and external heating to meet the higher requirements of the ALD for the temperature field.

The cylindrical heater 8 is used to heat the gas channel member 7, thus preventing the precursors from condensing.

3. Deposition:

When the atomic layer deposition coating is started, the precursor is a metal-organic complex, for example, when the coated film is an indium oxide thin film, the precursor uses indium cyclopentadiene, or trimethylindium, when the coated film is an aluminum oxide thin film, the precursor uses trimethylaluminum. The precursor enters the cabin of the ALD equipment from the first gas inlet 11-1 of the cabin base 11, moves in the cabin as indicated by the arrow in FIG. 4, and finally is discharged from the cabin again through the first gas outlet 11-2 of the cabin base 11.

The gas, after passing through the cabin base 11, first enters the gas inlet passage 7-1 of the gas channel member 7, and the pressure of the gas will be released for the first time due to the increased diameter of the passage.

The gas continues to move and enters the hollow dome shaped shell 3 after passing through the joints of the hollow dome shaped shell 3, the cover plate 4, the uniformly distributed gas extraction plate 5 and the gas channel member 7, and the hollow design of the dome shaped shell makes the gas pressure released for the second time. Therefore, the hollow dome shaped shell and the gas channel can achieve the functions of gas pressure relief and pressure stabilization, which has played a certain role in stabilizing the gas flow field.

The gas continues to move from an outlet at the top of the hollow dome shaped shell 3 to a space where an inner surface of the dome shaped sample 18 is located, and flows in a narrow space formed by the inner surface of the dome shaped sample 18 and the outer surface of the hollow dome shaped shell 3. At the moment, the inner surface of the dome shaped sample 18 and the outer surface of the hollow dome shaped shell 3 jointly play a role in limiting and guiding the gas flow field, which is conducive to completing the chemical absorption and reaction by actively guiding the gas to move along the inner surface of the dome shaped sample 18.

Finally, a tail gas after the adsorption and reaction in the previous step is collected by the gas extraction plate 5 and discharged out of the cabin through an exhaust passage of the gas channel member 7. The gas extraction plate 5 is disc-shaped, and a circle of gas through holes with the consistent diameter are evenly distributed on the side surface, thus achieving uniform gas extraction in the direction of 360°. The gas extraction plate 5 is in cooperation with the flow guiding function of the inner surface of the gas channel member 7 and the outer surface of the hollow dome shaped shell 3 to achieve more uniform flow field distribution. A height of the gas extraction plate 5 is lower than a lower edge of the dome shaped sample 18. By sinking a gas extraction port, a flow field distribution at an edge of the sample is improved, which is more conducive to the uniform deposition of a thin film at the edge.

In this embodiment, the characteristics of the atomic layer deposition device for uniform coating on the inner surface of the dome shaped surface are summarized as follows:

1. Cabin configuration:

The uniform coating on the inner surface of the dome shaped sample can be achieved through a special configuration design of the cabin.

2. Series Two-Stage Pressure Stabilizing Structure:

As described in the above working principle, the larger gas inlet passage 7-1 in the gas channel member 7 is used to achieve the first pressure relief, and the second pressure relief can be achieved in the hollow dome shaped shell 3. The gas channel member is connected to the hollow dome shaped shell in series to form a two-stage pressure stabilizing structure, which is used for stabilizing a gas pressure, conducive to acquiring a more stable gas flow field, and plays an important role in uniform coating.

3. Active Flow Guiding Structure:

As described in the above working principle, a gas is confined in a limited space between an inner surface of the dome shaped sample 18 and an outer surface of the hollow dome shaped shell 3, and the inner surface of the dome shaped sample 18 and the outer surface of the hollow dome shaped shell 3 form a good gas guiding effect, which is beneficial to the discrete and uniform movement of the gas.

4. Uniformly Distributed Gas Extraction Structure:

As described in the above working principle, a reaction tail gas is collected by the gas extraction plate 5, and then discharged from the cabin. A circle of gas extraction holes with uniform diameter are uniformly distributed on a side wall of the gas extraction plate, which can achieve synchronous gas extraction in a 360° direction, thus further improving the uniformity of the flow field. And the uniformly distributed gas extraction plate 5 is located below a lower edge of the dome shaped sample to be away from the sample, thus achieving far-end gas extraction and reducing the disturbance of a flow field near the gas extraction port on the uniform coating.

5. Internal and External Synchronous Radiative Heating Structure:

As described in the above working principle, the dome shaped heater 2 is used to heat the sample from the outside, the disc heater 6 is used to heat three components of the hollow dome shaped shell, the cover plate and the gas extraction plate, the high-temperature thermal radiation of the hollow dome shaped shell is used to heat the sample from the inside, and the annular heater 17 is used to heat an upper portion of the sample support 9 to prevent heat flow loss. Through internal and external bidirectional heating, the temperature gradient of the sample is reduced to achieve a more uniform and stable temperature field, thus satisfying the higher requirements of the ALD for a temperature field and improving the quality of the film layer.

Figure 22:
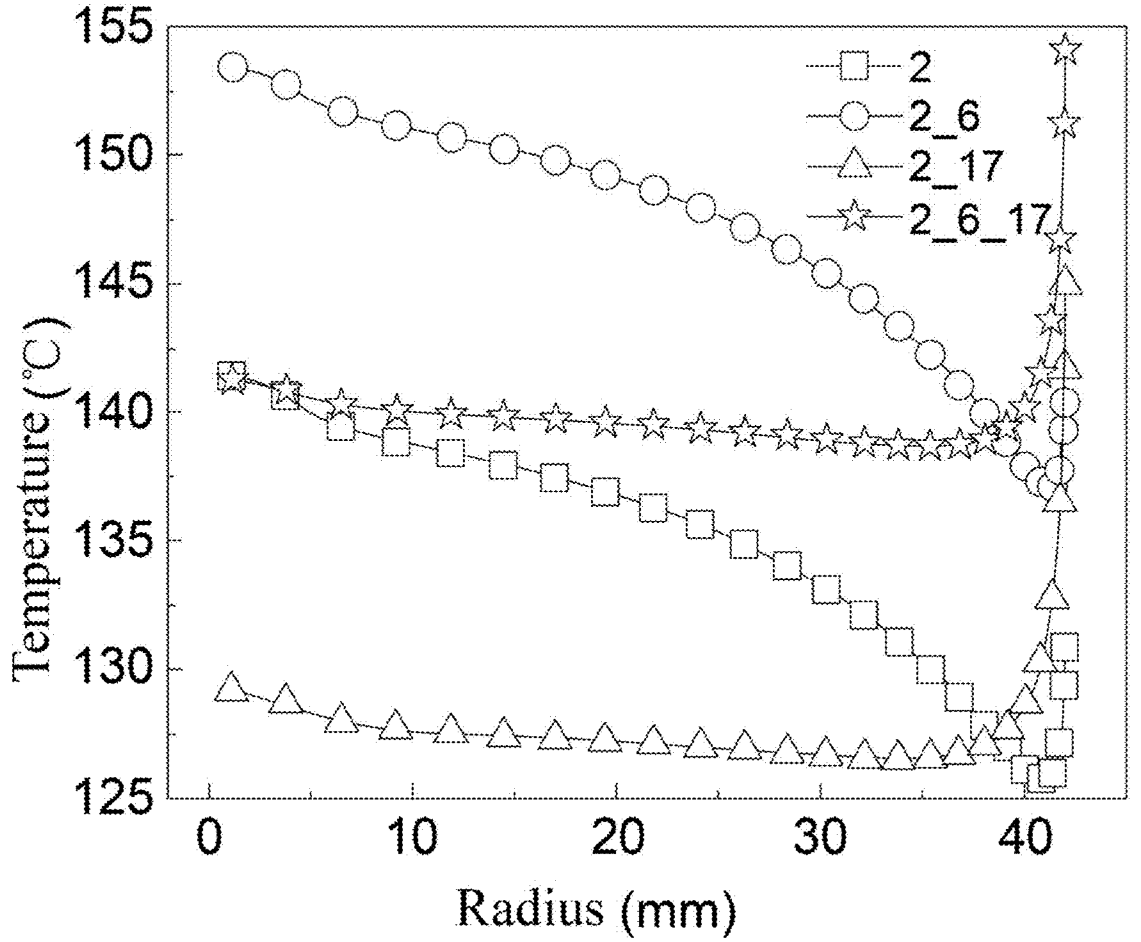
FIG. 22 is a test diagram of the influence rule of heating modes on a temperature field of an inner surface of a dome shaped sample in an embodiment, where □, ○, Δ and ☆ in the figure represent four heating schemes, respectively.

FIG. 22 is a temperature distribution on an inner surface of a dome shaped sample under different heating modes. As the inner surface of the sample is a film layer growth surface, the temperature distribution on the inner surface is mainly monitored, and used as the standard for measuring the heating effect. The label number in the figure denotes the serial number of the heater, and different number combinations represent different heater setting schemes. The main function of the cylindrical heater 8 is to heat a gas inlet pipeline to prevent the gas from condensing, without considering the influence on the temperature field of the sample. The influence of the dome shaped heater 2, the disc heater 6 and the annular heater 17 on the temperature field on the inner surface of the dome shaped sample is emphatically considered. There are four schemes as follows:

(1) dome shaped heater 2

(2) dome shaped heater 2+disc heater 6

(3) dome shaped heater 2+annular heater 7

(4) dome shaped heater 2+disc heater 6+annular heater 7

Figure 23:
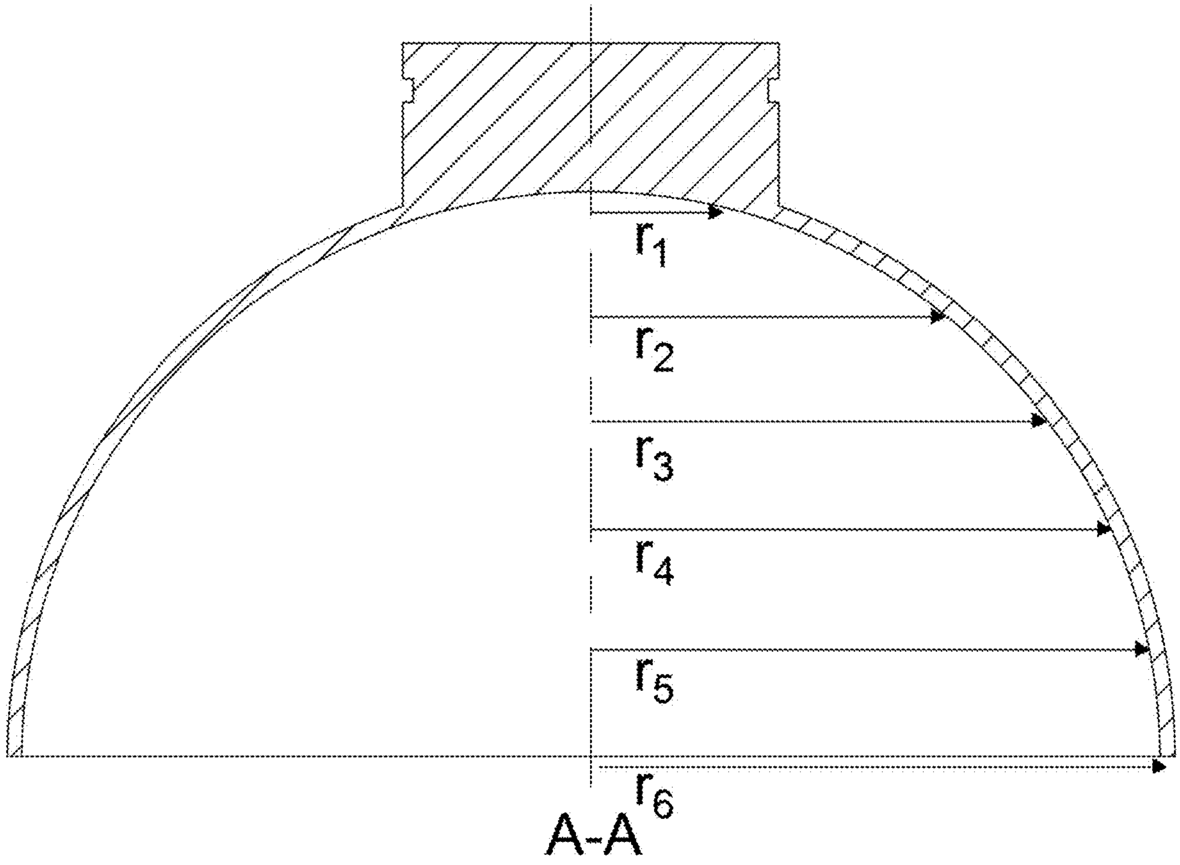
FIG. 23 is a schematic diagram of coordinates of temperature measuring points on an inner surface of a dome shaped sample in an embodiment.

As shown in FIG. 22, when the dome shaped sample is heated to about 140° C. by different heating schemes, the corresponding temperature field distribution on the inner surface. A definition method of abscissa radius and a corresponding position point on the inner surface of the sample are shown in FIG. 23. As can be seen from FIG. 22, the heating effect of Scheme (1) and Scheme (2) is poor, and the temperature at different positions on the inner surface of the entire dome shaped sample is constantly changing, with great fluctuation and poor temperature uniformity. Scheme (3) can keep good temperature uniformity in the radius range of 0-40 mm. Scheme (4) has the same effect as Scheme (3), and has excellent temperature uniformity. However, in Scheme (4), the role of the disc heater 6 is considered, which can keep the gas inlet system warm, and has an important and positive effect in preventing the precursors from condensing and improving the use efficiency of the precursors. By above analysis, a heating mode consistent with Scheme (4) is finally used in this embodiment to achieve excellent temperature uniformity effect.

What is claimed is:

1. An atomic layer deposition device for uniform coating on an inner surface of a dome shaped surface, comprising a cabin cover (1), a dome shaped heater (2), a hollow dome shaped shell (3), a cover plate (4), a gas extraction plate (5), a disc heater (6), a gas channel member (7), a cylindrical heater (8), a sample support (9), a cabin (10), and a cabin base (11), wherein a first gas inlet (11-1) and a first gas outlet (11-2) are formed in the cabin base (11); the gas channel member (7) is cylindrical, a gas inlet passage (7-1) and a gas outlet passage (7-2) are formed in the gas channel member (7) along an axial direction of the gas channel member (7); the gas channel member (7) is vertically fixed to an upper surface of the cabin base (11), the gas inlet passage (7-1) in the gas channel member (7) is in communication with the first gas inlet (11-1), and a gas outlet passage (7-2) in the gas channel member (7) is in communication with the first gas outlet (11-2); the cylindrical heater (8) is sleeved outside the gas channel member (7);

the gas extraction plate (5) is disc-shaped, a peripheral edge (5-3) is formed on an upper surface of the gas extraction plate (5) in a circumferential direction of the gas extraction plate (5), a plurality of gas holes (5-4) are formed in the peripheral edge (5-3) in a radial direction of the peripheral edge (5-3), and the plurality of gas holes (5-4) are uniformly distributed in the circumferential direction of the gas extraction plate (5); a second gas inlet (5-1) and a second gas outlet (5-2) are formed in the gas extraction plate (5), a flange (5-5) is arranged on a circumference of the second gas inlet (5-1), and an upper surface of the peripheral edge (5-3) and an upper surface of the flange (5-5) are flush with each other; the cover plate (4) covers the gas extraction plate (5) and is fixed to the gas extraction plate (5); a third gas inlet (4-1) is formed in the cover plate (4), and in communication with the second gas inlet (5-1); a gas cavity is enclosed by the peripheral edge (5-3), the flange (5-5) and the cover plate (4);

the gas extraction plate (5) is fixed to an upper surface of the gas channel member (7), the second gas inlet (5-1) is in communication with the gas inlet passage (7-1) in the gas channel member (7), and the second gas outlet (5-2) is in communication with the gas outlet passage (7-2) in the gas channel member (7); the disc heater (6) is arranged on a lower surface of the gas extraction plate (5), the hollow dome shaped shell (3) is fixed to an upper surface of the cover plate (4), and a central gas hole (3-1) is formed in a center of the hollow dome shaped shell (3);

the sample support (9) is mounted on the cabin base (11), and sleeved outside the gas channel member (7); an annular platform (9-1) is formed on a top of the sample support (9), and a dome shaped sample (18) is placed on the annular platform (9-1) and is located above and covers the hollow dome shaped shell (3); a ventilation gap is arranged between the dome shaped sample (18) and the hollow dome shaped shell (3), and a further ventilation gap is arranged between the sample support (9) and the cover plate (4) as well as the gas extraction plate (5);

the cabin (10) is mounted on the cabin base (11), and sleeved outside the sample support (9), a top of the cabin (10) is covered with the cabin cover (1), the dome shaped heater (2) is arranged on a lower surface of the cabin cover (1), and the dome shaped heater (2) covers an upper portion of the dome shaped sample (18).

2. The atomic layer deposition device for uniform coating on the inner surface of the dome shaped surface according to claim 1, wherein the cabin base (11) is disc-shaped.

3. The atomic layer deposition device for uniform coating on the inner surface of the dome shaped surface according to claim 1, wherein the gas channel member (7) is fixedly connected to the cabin base (11) through a plurality of first bolts (12).

4. The atomic layer deposition device for uniform coating on the inner surface of the dome shaped surface according to claim 1, wherein a diameter of the gas inlet passage (7-1) is greater than a diameter of the gas outlet passage (7-2).

5. The atomic layer deposition device for uniform coating on the inner surface of the dome shaped surface according to claim 1, wherein the gas extraction plate (5) is fixed to the upper surface of the gas channel member (7) through a plurality of fourth bolts (15).

6. The atomic layer deposition device for uniform coating on the inner surface of the dome shaped surface according to claim 1, wherein the hollow dome shaped shell (3), the cover plate (4), the gas extraction plate (5) and the disc heater (6) are connected through a plurality of fifth bolts (16).

7. The atomic layer deposition device for uniform coating on the inner surface of the dome shaped surface according to claim 1, wherein the ventilation gap between the dome shaped sample (18) and the hollow dome shaped shell (3) has a width of 1 mm-2 mm.

8. The atomic layer deposition device for uniform coating on the inner surface of the dome shaped surface according to claim 1, wherein the lower surface of the cabin cover (1) is in threaded connection with the dome shaped heater (2).

9. The atomic layer deposition device for uniform coating on the inner surface of the dome shaped surface according to claim 1, wherein the hollow dome shaped shell (3) is replaced with a deep-arched dome shaped shell (3-1).

10. The atomic layer deposition device for uniform coating on the inner surface of the dome shaped surface according to claim 1, wherein an annular heater (17) is arranged on a lower surface of the annular platform (9-1).

* * * * *